(12) United States Patent
Ricca et al.

(10) Patent No.: US 7,343,538 B2
(45) Date of Patent: Mar. 11, 2008

(54) PROGRAMMABLE MULTI-FUNCTION MODULE FOR AUTOMATIC TEST EQUIPMENT SYSTEMS

(75) Inventors: Paolo Dalla Ricca, Fremont, CA (US); Moussa Iskandar, Fremont, CA (US); Peter Cockburn, Pleasanton, CA (US)

(73) Assignee: Credence Systems Corporation, Milpitas, CA (US)

( * ) Notice: Subject to any disclaimer, the term of this patent is extended or adjusted under 35 U.S.C. 154(b) by 668 days.

(21) Appl. No.: 10/366,839

(22) Filed: Feb. 13, 2003

(65) Prior Publication Data

US 2004/0177293 A1    Sep. 9, 2004

(51) Int. Cl.
*G06F 11/00* (2006.01)
*G01R 31/02* (2006.01)

(52) U.S. Cl. .................................. 714/740; 324/754

(58) Field of Classification Search ........ 714/736–745, 714/724

See application file for complete search history.

(56) References Cited

U.S. PATENT DOCUMENTS 5,748,124 A * 5/1998 Rosenthal et al. .......... 341/120
6,144,721 A * 11/2000 Stephens ....................... 379/21
6,175,939 B1 * 1/2001 Dinteman .................... 714/724
6,687,868 B1 * 2/2004 Furukawa et al. .......... 714/740
6,704,897 B1 * 3/2004 Takagi ........................ 714/739
6,966,019 B2 * 11/2005 Viens et al. ................. 714/724
2004/0162694 A1 * 8/2004 Ricca et al. ................. 702/127

OTHER PUBLICATIONS

Phillip L. De Leon, On the Use of Filter Banks for Parallel Digital Signal Processing, 1998, 7th NASA Symposium on VLSI Design 1998, 1-9.*

* cited by examiner

*Primary Examiner*—Cynthia Britt

(57) ABSTRACT

A programmable source/measurement module for automatic test equipment is disclosed. A high resolution low frequency source, high resolution low frequency measurement capability, low resolution high frequency source, and a low resolution high frequency measurement capability are provided in a single module. The module comprises an input/output switch matrix selectively coupled to a low frequency filter block and a high frequency filter block. Each filter block may be used for either source or measurement. The filter blocks are selectively coupled to a plurality of analog-to-digital converters (ADCs) and digital-to-analog converters (DACs). The ADCs and DACs are coupled to a digital interface.

20 Claims, 13 Drawing Sheets

PROGRAMMABLE MULTI-FUNCTION MODULE FOR AUTOMATIC TEST EQUIPMENT SYSTEMS

FIELD OF THE INVENTION

The present invention relates to Automatic Test Equipment (ATE) used to test integrated circuits (ICs). More specifically, the invention is directed to systems for performing testing on ICs that incorporate analog functions.

BACKGROUND ART

Advances in semiconductor design and fabrication have resulted in ICs with a wide range of functions and performance parameters. Individual analog and mixed signal ICs may be housed in packages having hundreds of pins. In addition to the requirement for testing highly complex individual circuits, parallel testing of multiple ICs with low pin counts also requires a large number of contacts to be made.

In ATE systems, the device(s) being tested are typically mounted on a loadboard that provides a socket for receiving the device(s) under test (DUT) on one side, and a series of contacts on the other side. The printed circuits on the loadboard provide a fixed mapping of the contacts to the pins of the DUT. Each IC design/package type will typically have a dedicated loadboard for testing. Loadboards with characterized loads may also be used for calibration of the ATE.

The contact array of the load board mates to a DUT contactor that has a corresponding array of spring loaded electrical contacts (pogo pins) that provide an electrical connection to the test electronics that can be repeatedly cycled without degradation. The mechanical and electrical requirements of the DUT interface limit the number of pins that may be used in the device contactor, and thus limit the number of available test modules in the ATE at any given time.

The test modules used for analog testing may be divided into two general categories of source and measure, with each category being further divided on the basis of low and high frequency. For testing based upon digital instruments, there is also a division on the basis of resolution that is correlated with frequency. Low frequency testing typically requires greater resolution than high frequency testing, and high resolution is also easier to achieve at lower frequencies.

For example, digital testing of analog audio may require a bandwidth of 0-20 kHz, a signal-to-noise ratio greater than 100 dB, and a resolution of 18-24 bits. Nominally, the low frequency test range is from DC to about 100 kHz or 200 kHz. Low frequency test resolution may be about 18 bits or greater.

High frequency test applications include video circuits for set-top box (STB), and digital versatile disc (DVD), analog-to-digital converters (ADCs), and digital-to-analog-converters (DACs). Other high frequency test requirements include communications circuits such as intermediate frequency (IF) and digital subscriber line (DSL) circuits. The high frequency range is nominally from about 100 kHz or 200 kHz and higher. The resolution for high frequency digital testing is typically less than 18 bits.

Traditionally, each analog resource has required an individual dedicated circuit board. In order to provide source and measurement functions over both low and high frequency ranges, four modules have been required, each with its own set of fixed connections to pogo pins and the control hardware. In the context of the present invention, control hardware is defined as the portion of an ATE system that provides the interface between a human user and a module.

The fixed connections and single function modules of present ATE systems limit the flexibility for testing of analog functions, and also make reconfiguration of the ATE a laborious process. When a different mix of source and measure, or high and low frequency modules is required, modules must be physically removed, replaced, and recabled.

Another difficulty is presented by devices with test requirements of devices that span the boundary between high and low frequency test modules. Due to the tradeoff between resolution and frequency range, it is not uncommon for a broadband device to require testing by both low and high frequency modules.

SUMMARY OF INVENTION

Accordingly, embodiments of the present invention provide a single module that is capable of providing both low and high frequency range source and measurement. Embodiments of the present invention improve the flexibility of automated test equipment (ATE) by providing increased per-pin functionality without requiring physical reconfiguration.

In an embodiment of the present invention, a high resolution low frequency source, high resolution low frequency measurement capability, low resolution high frequency source, and a low resolution high frequency measurement capability are provided in a single module. The module comprises an input/output switch matrix coupled to a low frequency filter block and a high frequency filter block. Each filter block may be used for either source or measurement. The filter blocks are coupled to a plurality of analog-to-digital converters (ADCs) and digital-to-analog converters (DACs). The ADCs and DACs are coupled to a digital interface.

In a particular embodiment of the present invention, a DAC or ADC in the high or low frequency source and measurement signal path may be selected from a plurality of available DACs or ADCs.

These and other objects and advantages of the present invention will no doubt become obvious to those of ordinary skill in the art after having read the following detailed description of the preferred embodiments which are illustrated in the various drawing figures.

DESCRIPTION OF THE PREFERRED EMBODIMENTS

In the following detailed description of the present invention, a programmable multi-function module for automatic test equipment (ATE), numerous specific details are set forth in order to provide a thorough understanding of the present invention. However, it will be obvious to one skilled in the art that the present invention may be practiced without these specific details. In other instances well known methods involving well-known circuits, components, test protocols, interfaces, etc., have not been described in detail so as not to unnecessarily obscure aspects of the present invention.

Figure 1:
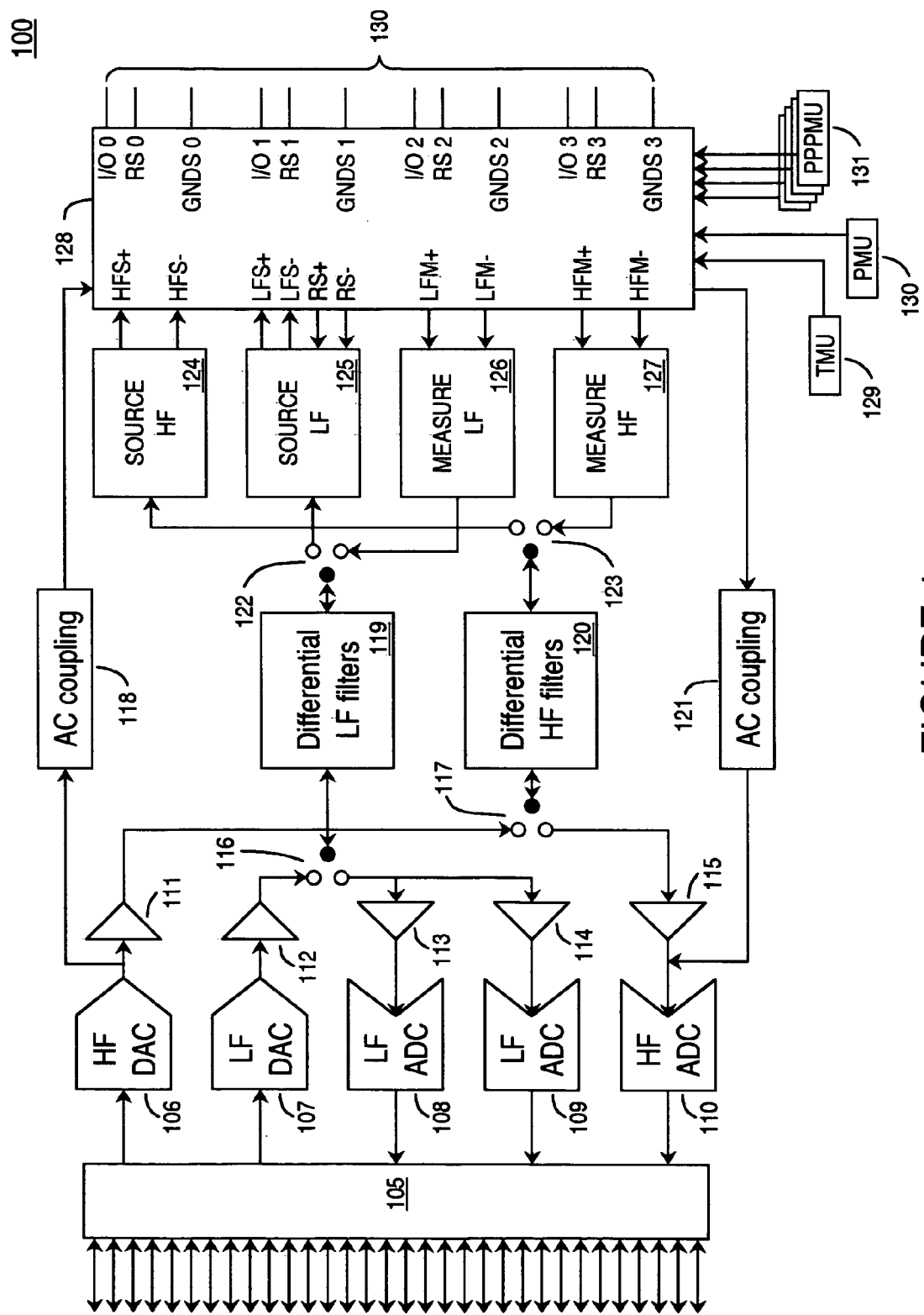
FIG. 1 shows a high level block diagram for a multi-function ATE test module in accordance with an embodiment of the present claimed invention.

FIG. 1 shows a high level block diagram 100 for a multi-function ATE test module in accordance with an embodiment of the present invention. The module provides source and measurement capability for both high and low frequency ranges with selectable resolution. The module is preferably implemented using a single circuit board that may be connected to other components by plugging into a slot or socket (e.g., a backplane) and/or cable connectors.

A digital interface 105 (e.g., 32 bit) provides a link to a test controller. The digital interface 105 provides transmit and receive capabilities. The digital interface also provides for control of the signal routing relays, and thus determines the signal paths for source and measurement. At program initialization, the module is programmed as either a source module or a measurement module, with either the DACs or ADCs being available. During test execution, a different DAC or ADC may be selected from within an available set of DACs or ADCs. For example, if the module shown in FIG. 1 were configured for measurement, selection between ADCs 108, 109, and 110 may be made on the fly. Likewise, the relay selectable characteristics of the analog functional blocks may also be set on the fly.

A high frequency (HF) digital-to-analog converter (DAC) 106 is coupled to the digital interface 105 and a driver 111, whose output is coupled to a relay 117. Similarly, A low frequency (LF) digital-to-analog converter (DAC) 107 is coupled to the digital interface 105 and a driver 112, whose output is coupled to a relay 116. The HF DAC 106 preferably has a resolution that is greater than or equal to 14 bits, and the LF DAC preferably has a resolution of at least 24 bits.

A LF analog-to-digital converter (ADC) 108 is coupled to the digital interface 105 and to a driver 113, whose input is coupled to relay 116. LF ADC 108 preferably has a resolution of at least 24 bits. A LF analog-to-digital converter (ADC) 109 is coupled to the digital interface 105 and to a driver 114, whose input is coupled to relay 116. LF ADC 109 preferably has a resolution of at least 18 bits. A HF analog-to-digital converter (ADC) 110 is coupled to the digital interface 105 and to a driver 115, whose input is coupled to relay 117. HF ADC 110 preferably has a resolution of at least 14 bits.

Relay 116 selectively couples the LF source DAC 107, and the LF measurement ADCs 113 and 114 to the LF filter bank 119. Thus, the single filter bank 119 is shared by both the source and measurement signal paths. Relay 117 selectively couples the HF source DAC 106 and the HF measurement ADC 110 to the HF filter bank 120. The HF filter bank 120 is also shared by both the source and measurement signal paths.

The LF filter bank 119 is selectively coupled by relay 122 to LF source block 125 and LF measure block 126. The HF filter bank 120 is selectively coupled by relay 123 to HF source block 124 and HF measure block 127. The source and measure blocks may provide signal conditioning functions such as amplification, attenuation, and offset generation through circuits such as amplifiers, attenuators, and DC sources.

The input/output (I/O) switch matrix 128 selectively couples each of the measure and source blocks 124, 125, 126, and 127 to an array of pogo pin outputs 130. Each of the measure and source blocks has an associated pair of respective differential inputs or outputs (e.g., HFS+ and HFS−) that are coupled to the switch matrix 128. The LF source block 125 may also have remote sense inputs RS+ and RS−. The switch matrix 128 allows multiple device pins to be tested in turn without having to fit additional switching relays on the external loadboard.

In the example of FIG. 1, the pogo pin array 130 is arranged as four groups of three pins each, with each group comprising an analog I/O pin, a GNDS (ground sense) pin and an RS (remote sense) pin. The switch matrix 128 thus has four analog input/output ports that may be selectively coupled to any of the ADCs or DACs through a variety of filters.

AC coupling 118 is provided between the output of HF DAC 106 and the switch matrix 128 to allow source signals to optionally bypass the major portion of the analog chain. Similarly, AC coupling 121 is provided between the switch matrix 128 and the input of HF ADC 110 to allow measurement signals to bypass the major portion of the measurement analog chain.

The switch matrix 128 may also selectively couple a timing measurement unit (TMU) 129, a parametric measurement unit (PMU) 130, and a set of per-pin parametric measurement units (PPPMU) 131 to the array 130. The TMU 129 may be used to perform timing calibration of the analog chains. The PMU 130 may be used to perform levels calibration of the analog chain. The PPMU 131 may be used to perform shorts and opens tests on the DUT pins before analog testing begins.

Figure 2A:
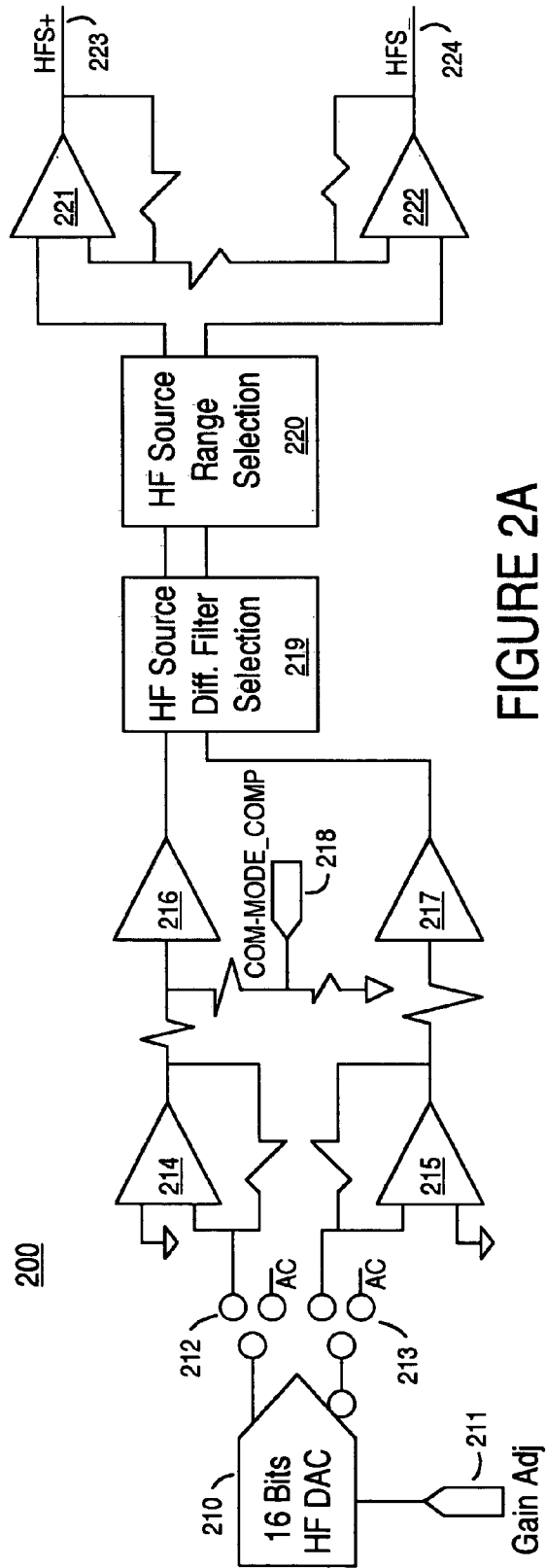
FIG. 2A shows a block diagram for a high frequency source analog chain for the module of FIG. 1 in accordance with an embodiment of the present claimed invention.

FIG. 2A shows a block diagram for an exemplary high frequency source analog chain 200 for the module 100 of FIG. 1 in accordance with an embodiment of the present invention. A 16 bit HF DAC 210 has a pair of differential outputs coupled to relays 212 and 213. Relays 212 and 213 provide selection between the analog chain and AC coupling. Operational amplifiers 214 and 215 form the first stage of the analog chain, with input coupled to relays 212 and 213. The outputs of operational amplifiers 214 and 215 are coupled to the inputs of operational amplifiers 216 and 217, which form the second stage of the analog chain. Common mode compensation 218 is coupled to the input of operational amplifier 216.

The outputs of operational amplifiers 216 and 217 are coupled to the HF differential filter bank 219, which is in turn coupled to the HF source and range selection block 220. The outputs of the block 220 are coupled to the inputs of operational amplifiers 221 and 222, which form the output stage of the analog chain with differential outputs HFS+ 223 and HFS− 224.

Figure 2B:
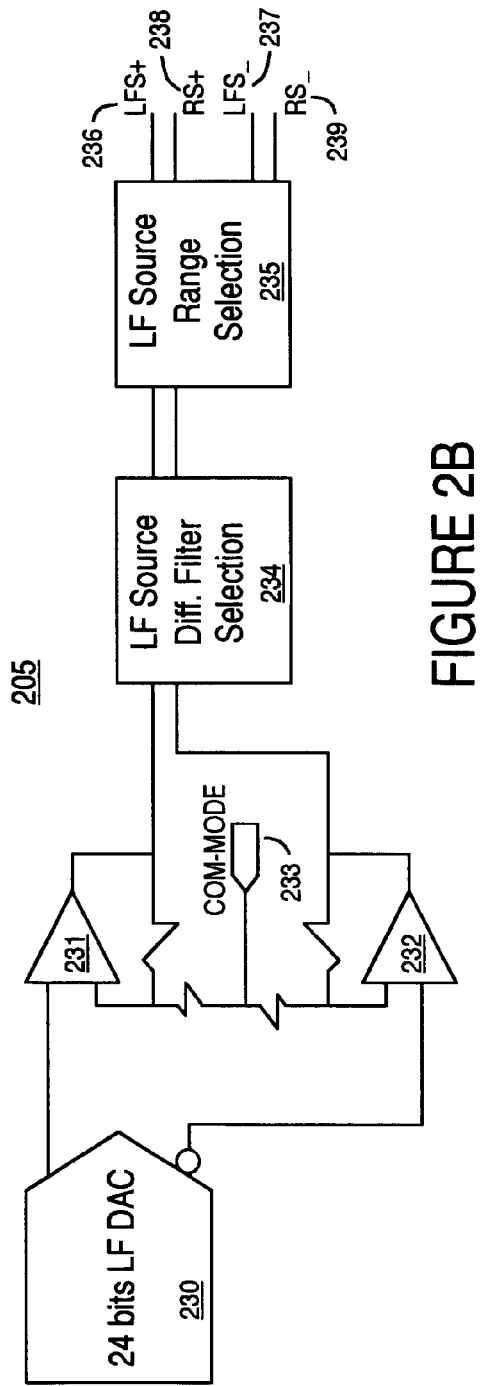
FIG. 2B shows a block diagram for a low frequency source analog chain for the module of FIG. 1 in accordance with an embodiment of the present claimed invention.

FIG. 2B shows a block diagram 205 for a low frequency source analog chain for the module 100 of FIG. 1 in accordance with an embodiment of the present invention. A 24 bit LF DAC 230 has differential outputs coupled to operational amplifiers 231 and 232. A common mode input 233 is also coupled to operational amplifiers 231 and 232. The outputs of operational amplifiers 231 and 232 are coupled to the LF differential filter bank 234, which is in turn coupled to the LF source and range selection 235. The LF source and range selection 235 has outputs LFS+ 236 and LFS− 237, and remote sense inputs RS+ 238 and RS− 239.

Figure 3:
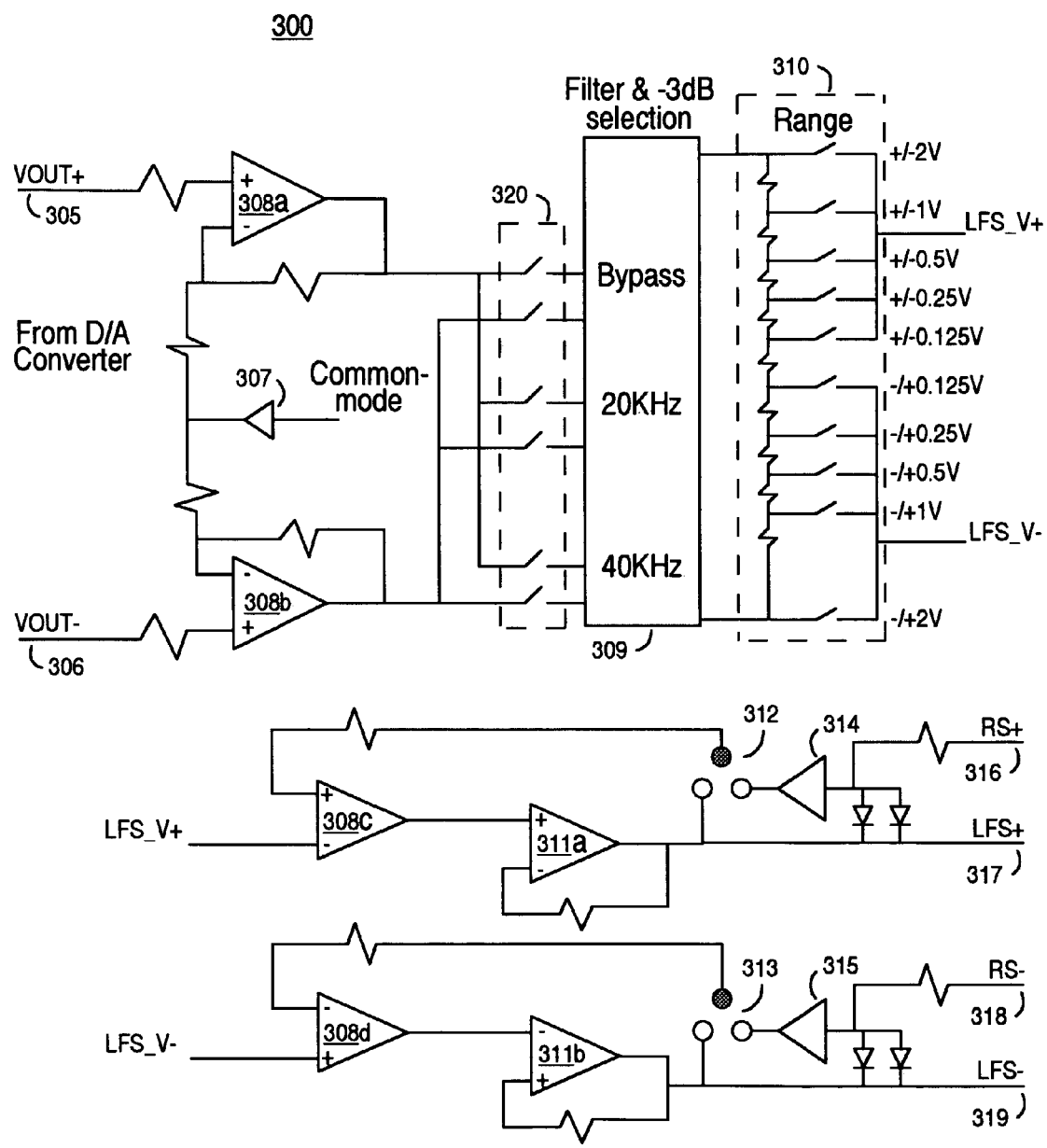
FIG. 3 shows a schematic diagram for the low frequency source analog chain of FIG. 2B in accordance with an embodiment of the present claimed invention.

FIG. 3 shows a schematic diagram for the low frequency source analog chain of FIG. 2B in accordance with an embodiment of the present invention. Inputs 305 and 306 (Vout+ and Vout− from the LF DAC) are applied to the positive inputs of a first pair of operation amplifiers 308a and 308b, with a common mode input 307 coupled to the negative inputs.

The outputs of the first pair of operational amplifiers 308a and 308b are coupled to a filter bank 309 by a relay 320. The filter bank is in turn coupled to a range selector 310. The output of the range selector 310 is coupled to a second pair of operational amplifiers 308c and 308d, which are cascaded with a pair of operational amplifiers 311a and 311b.

Relays 312 and 313 provide selection/deselection of remote sense by coupling the negative inputs of the second pair of operational amplifiers 308c and 308d to either the remote sense drivers 314 and 315 or the outputs LFS+ 317 and LFS− 319 of the pair of operational amplifiers 311a and 311b. The remote sense inputs RS+ 316, and RS− 318 are coupled to remote sense drivers 314 and 315 respectively. Operational amplifiers 308a-d are preferably low noise, low distortion devices (e.g., ANALOG DEVICES AD797), and operational amplifiers 311a-b are preferably ANALOG DEVICES AD811 devices.

Figure 4:
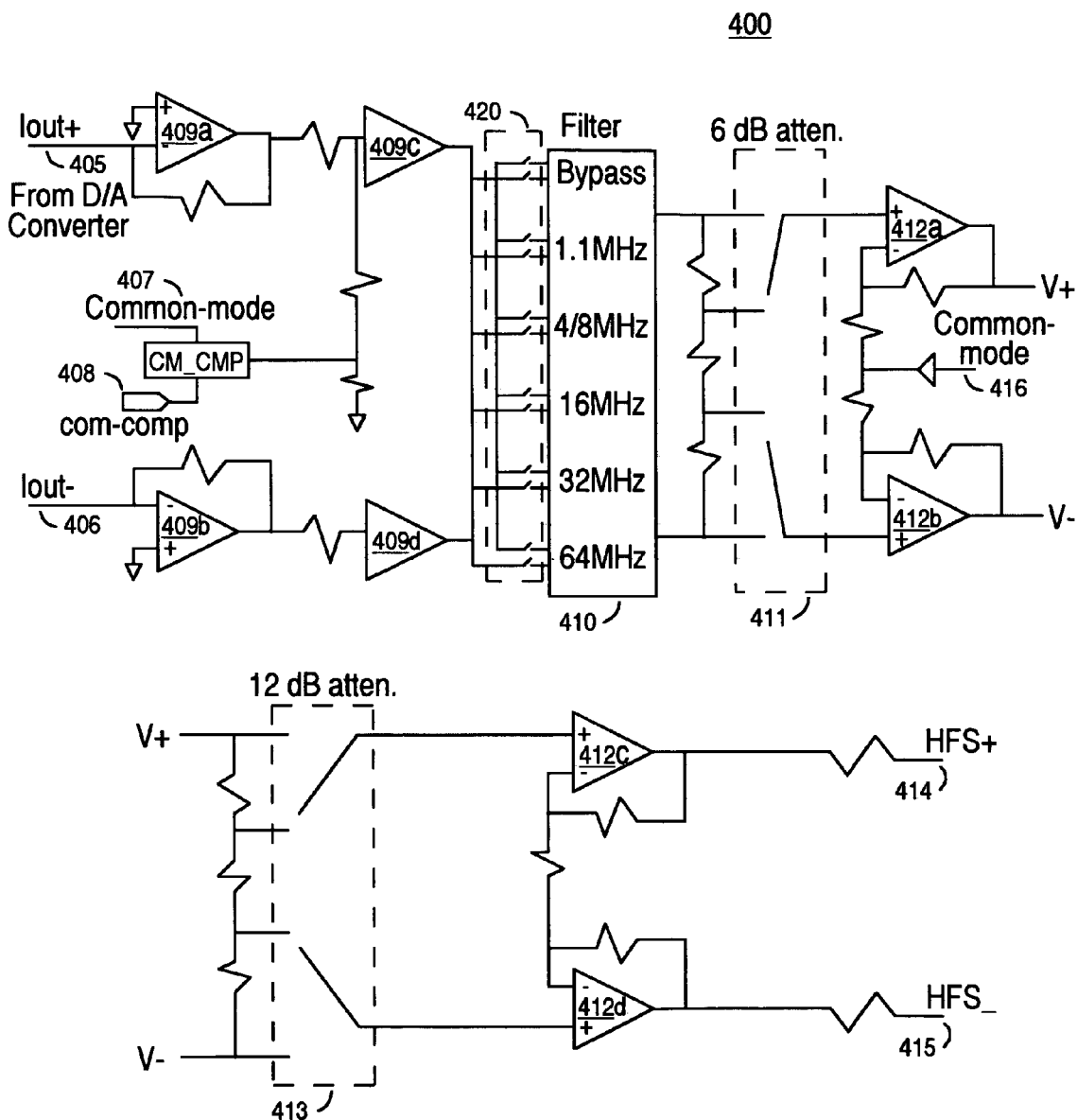
FIG. 4 shows a schematic diagram for the high frequency source analog of FIG. 2A in accordance with an embodiment of the present claimed invention.

FIG. 4 shows a schematic diagram 400 for the high frequency source analog chain of FIG. 2A in accordance with an embodiment of the present invention. Inputs 405 and 406 (Iout+ and Iout− from the HF DAC) are applied to the negative inputs of a first pair of operational amplifiers 409a and 409b. The outputs of the first pair of operational amplifiers 409a and 409b are coupled to the inputs of a second pair of operational amplifiers 409c and 409d. A common mode input 408 and common mode compensation 407 are coupled to the input of operational amplifiers 409c.

The outputs of the second pair of operational amplifiers 409b and 409c are coupled to a filter bank 410 by a relay 420. The filter bank is in turn coupled to a 6 dB attenuator 411, which is in turn coupled to a third pair of operational amplifiers 412a and 412b. A common mode input 416 is coupled to the negative input of operational amplifiers 412a and 412b. The differential outputs of 412a and 412b are coupled to an output pair of operational amplifiers 412c and 412d by a 12 dB attenuator 413. Differential outputs HFS+ 414 and HFS− 415 are provided by the final pair of operational amplifiers 412c and 412d.

Figure 5:
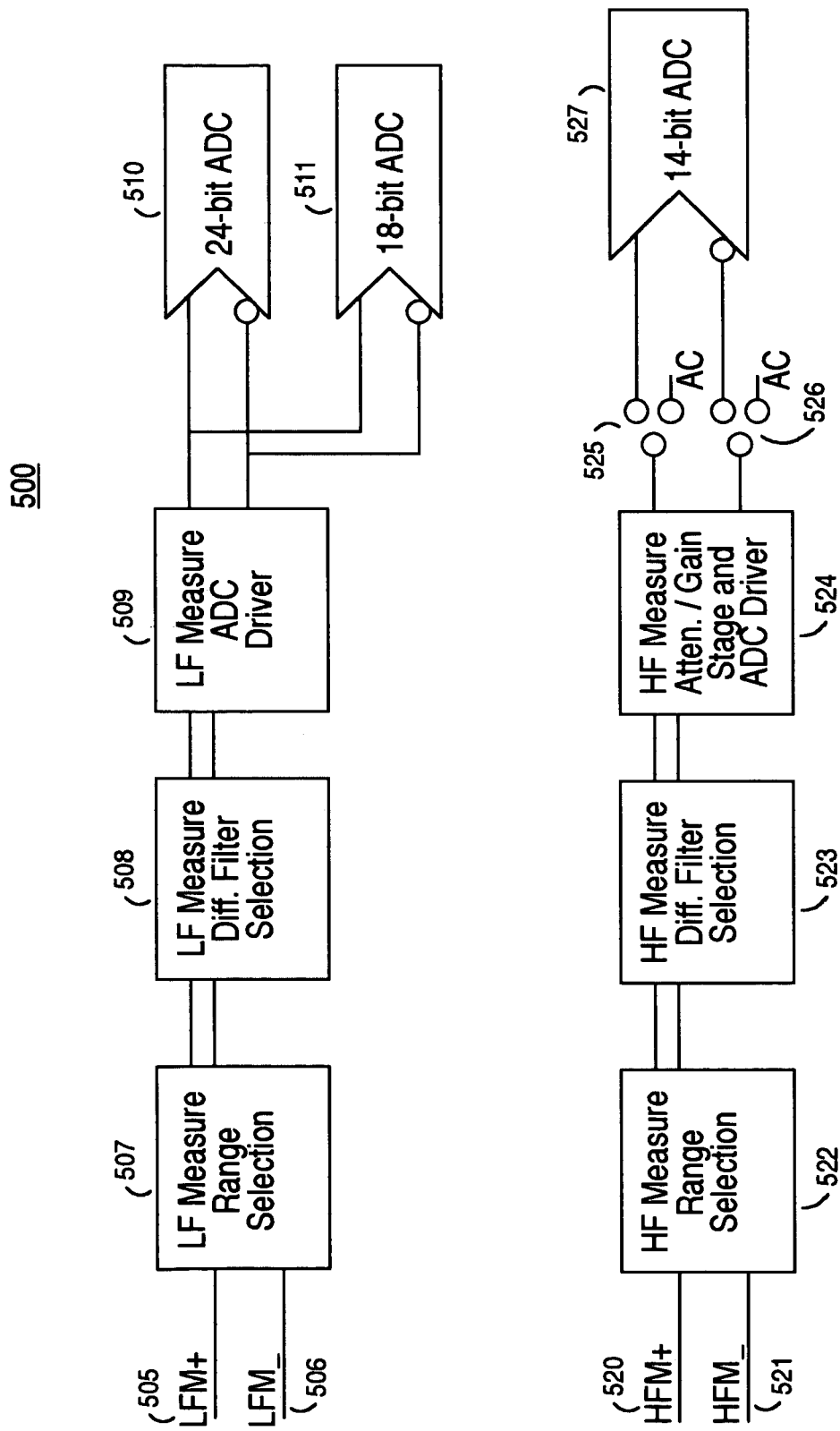
FIG. 5 shows a signal path diagram for the high and low frequency measurement chain of FIG. 1 in accordance with an embodiment of the present claimed invention.

FIG. 5 shows a signal path diagram 500 for the HF and LF measurement chains of FIG. 1 in accordance with an embodiment of the present claimed invention. Low frequency measure inputs LFM+ 505 and LFM− 506 are coupled to a LF measure and range selection block 507, which is in turn coupled to a differential filter bank 508. The filter bank 508 is coupled to a LF measure ADC driver 509. The driver 509 is coupled to a 24 bit ADC 510 and an 18 bit ADC 511.

HF measure inputs HFM+ 520 and HFM− 521 are coupled to a HF measure and range selection block 522, which is in turn coupled to a differential filter selection 523. The filter bank 523 is coupled to a HF measure Attenuation/Gain stage and ADC driver block 524. The outputs of driver block 524 are coupled to a 14 bit ADC 527 by AC bypass relays 525 and 526.

Figure 6:
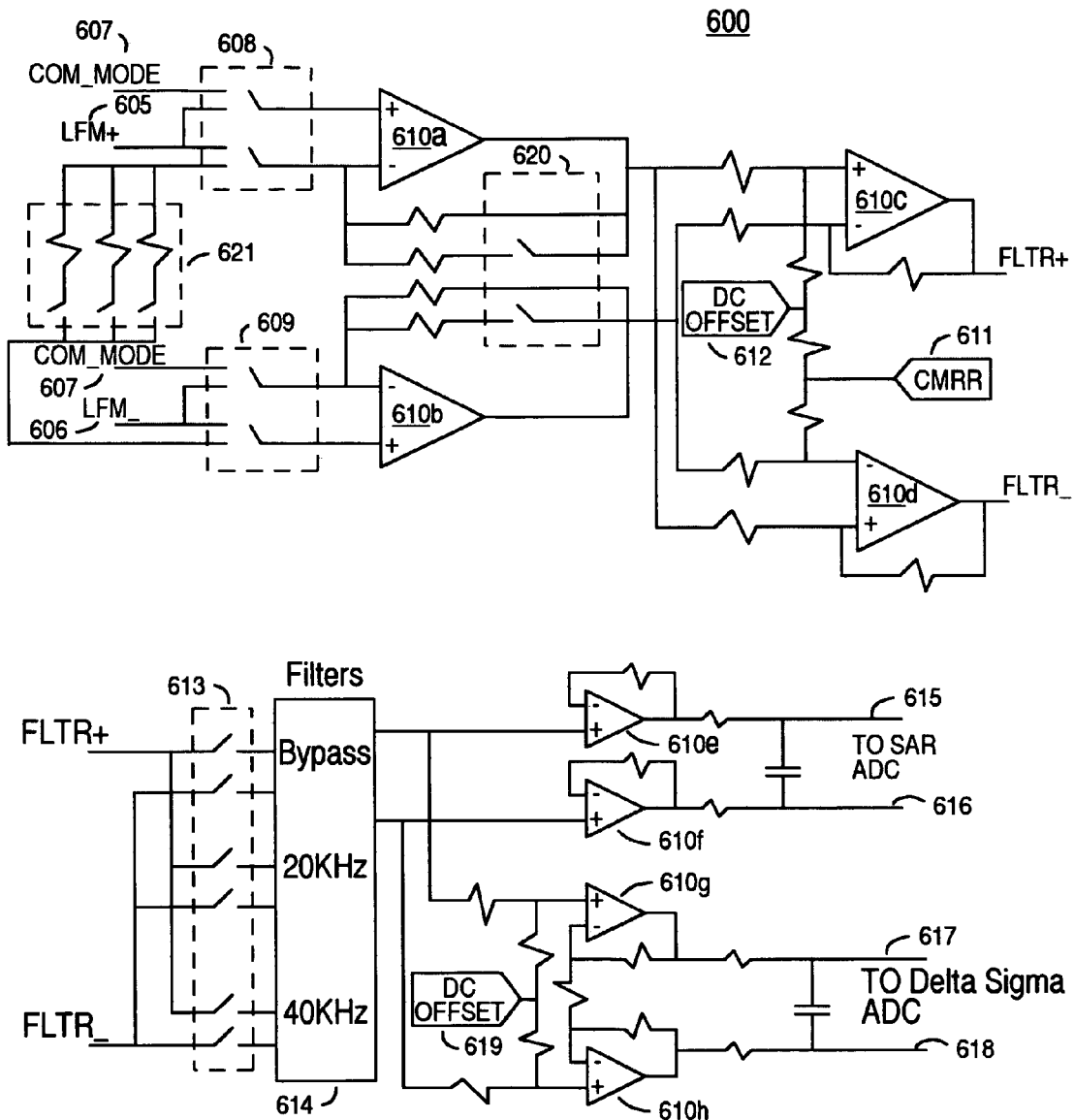
FIG. 6 shows a schematic diagram for the low frequency measurement chain of FIG. 5 in accordance with an embodiment of the present claimed invention.

FIG. 6 shows a schematic diagram 600 for the low frequency measurement chain of FIG. 5 in accordance with an embodiment of the present invention. Relays 608 and 609 couple differential inputs LFM+ 605 and LFM− 606, and common mode inputs 607 to a first pair of operational amplifiers 610a and 610b. The output of the first stage pair 610a and 610b is coupled to a second stage pair of operational amplifiers 610c and 610d. A CMRR input 611 and DC offset 612 are also coupled to the input of the second stage.

The input stage (610a and 610b) may be configured as either a voltage or transconductance amplifier. The first stage input terminals are coupled to the LFM (605, 606) and common mode inputs 607 in the transconductance configuration. In the voltage configuration, the inputs are coupled to the LFM (605, 606) inputs and a range specific resistor from resistor block 621. Feedback for the first stage (610a, 610b) is provided by a switched resistor block 620.

The output of the second stage (610c, 610d) is coupled to a filter bank 614 by a relay matrix 613. The output of the filter bank 614 is coupled to a first ADC driver pair of operational amplifiers 610e and 610f, for driving a successive approximation register (SAR) ADC (e.g., ANALOG DEVICES AD7679). A second pair of operational amplifiers 610g and 610h is also coupled to the filter bank 614, and are used to drive a delta-sigma ADC (e.g., AKM AK5394A). A DC offset 619 is coupled to the input of the second pair of operational amplifiers 610g and 610h.

Operational amplifiers 610a-h are preferably low distortion, low noise devices such as the ANALOG DEVICES AD797 or BURR-BROWN OPA627.

Figure 7:
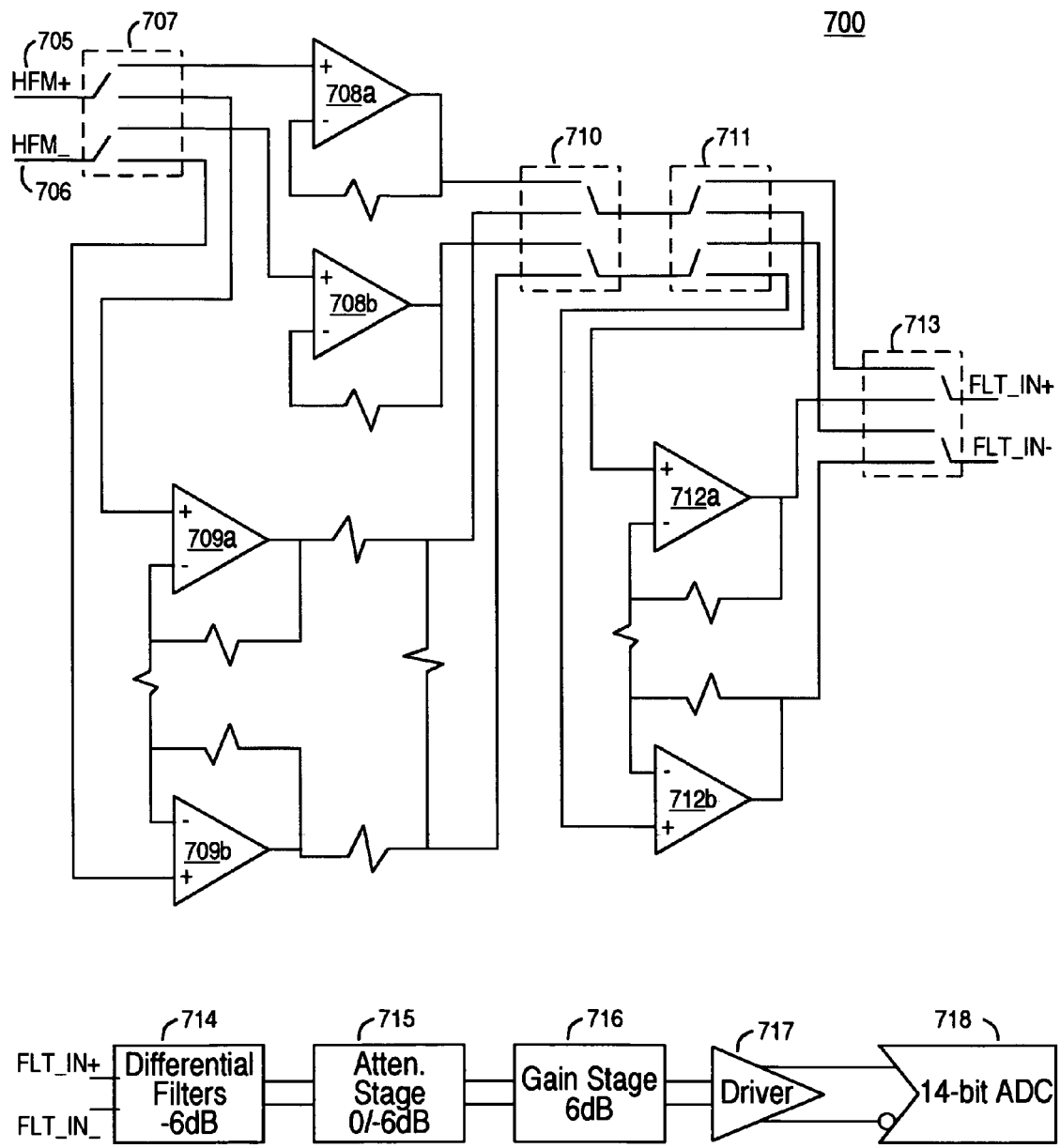
FIG. 7 shows a schematic diagram for the high frequency measurement chain of FIG. 5 in accordance with an embodiment of the present claimed invention.

FIG. 7 shows a schematic diagram 700 for the high frequency measurement chain of FIG. 5 in accordance with an embodiment of the present invention. HF inputs HFM+ 705 and HFM− 706 are coupled to a first input pair of operational amplifiers 708a and 708b, and a second input pair of operational amplifiers 709a and 709b, by a relay 707. The two input pairs may be used to provide selectable first stage gain. For example, A MAXIM MAX4108 may be used for 708a and 708b to provide unity gain, and a MAXIM MAX4308 may be used 709a and 709b to provide a higher gain.

The output from the input stages is selected by relay 710 and selectively coupled to an output pair of operational amplifiers 712a and 712b. The selectable output pair (712a, 712*b*) provides further gain flexibility, and preferably uses a low distortion device with a higher bandwidth than that used for 708*a* and 708*b* (e.g., MAXIM MAX4109). The output stage (712*a*, 712*b*) may be selectively bypassed by relay 711 and output relay 713. Output relay 713 is coupled to a filter bank 714 which is in turn coupled to an attenuator 715. The attenuator stage 715 is coupled to a gain stage 716, which is coupled to an ADC 718 by a driver 717. Depending upon the filter characteristics and the desired input to the driver 717, various values of attenuation and gain for stages 715 and 716 may be selected.

Gain stage 716 may use a MAXIM MAX4109 and be configured to provide 6 dB of gain, and driver 717 may be an ANALOG DEVICES AD8138. ADC 718 may be an ANALOG DEVICES AD6645.

Figure 8A:
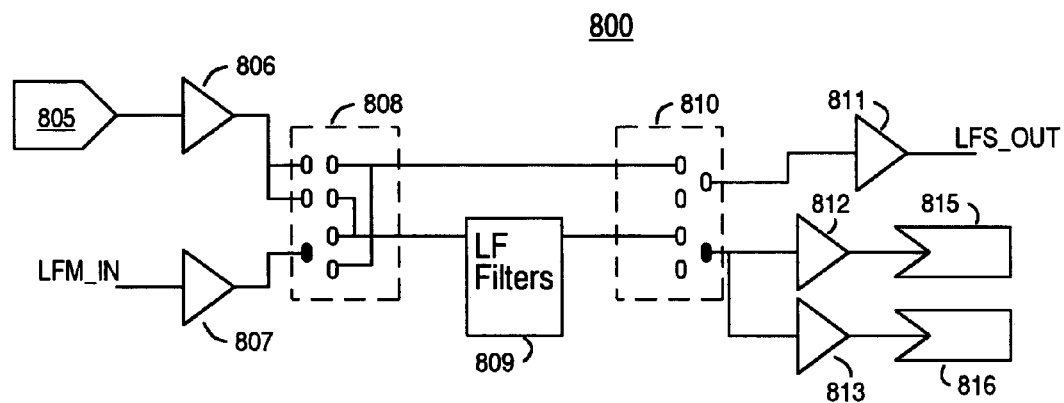
FIG. 8A shows a general block diagram for a shared LF filter bank in accordance with an embodiment of the present claimed invention.

FIG. 8A shows a general block diagram 800 for a shared LF filter bank 809 in accordance with an embodiment of the present invention. A signal source comprising a DAC 805 coupled to a driver 806, and a measurement input driver 807 accepting a signal LFM_IN are selectively coupled to one terminal of the filter bank 809 by a relay matrix 808. The second terminal of the filter bank 809 is selectively coupled by a relay matrix 809 to a source signal output driver 811, a first ADC driver 812, and a second ADC driver 813. The first ADC driver 812 is coupled to a first ADC 815 and the second ADC driver 813 is coupled to a second ADC 816. The source output signal LFS_OUT is taken from driver 811. Relay 808 and relay 810 are also directly coupled, providing for bypass of the filter bank 809.

Figure 8B:
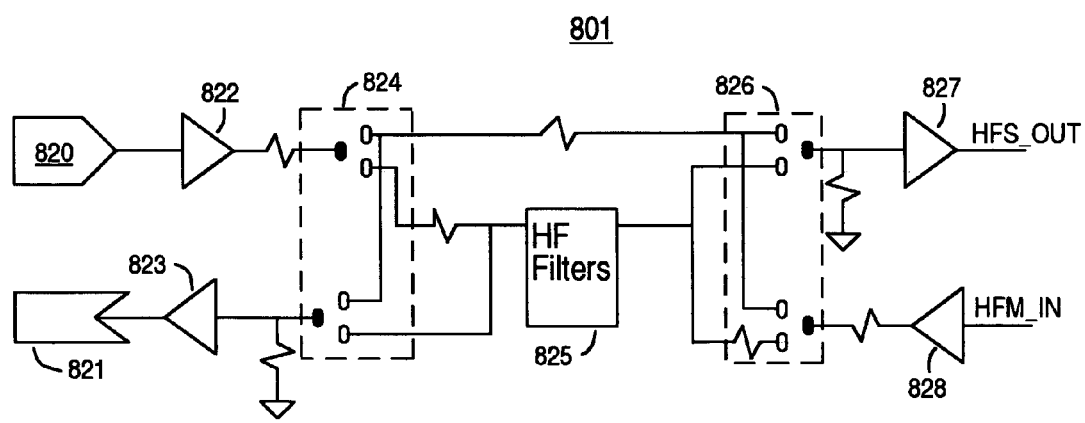
FIG. 8B shows a general block diagram for a shared HF filter bank in accordance with an embodiment of the present claimed invention.

FIG. 8B shows a general block diagram 801 for a shared HF filter bank 825 in accordance with an embodiment of the present invention. A signal source comprising a DAC 820 coupled to a driver 822, and an ADC driver 823 are selectively coupled to one terminal of the filter bank 825 by a relay matrix 824. The ADC driver 823 is coupled to an ADC 821. A second terminal of the filter bank 825 is selectively coupled by a relay matrix 826 to a source signal output driver 827, and a measurement input driver 828. Relay 824 and relay 826 are also directly coupled, providing for bypass of the filter bank 825.

Figure 9:
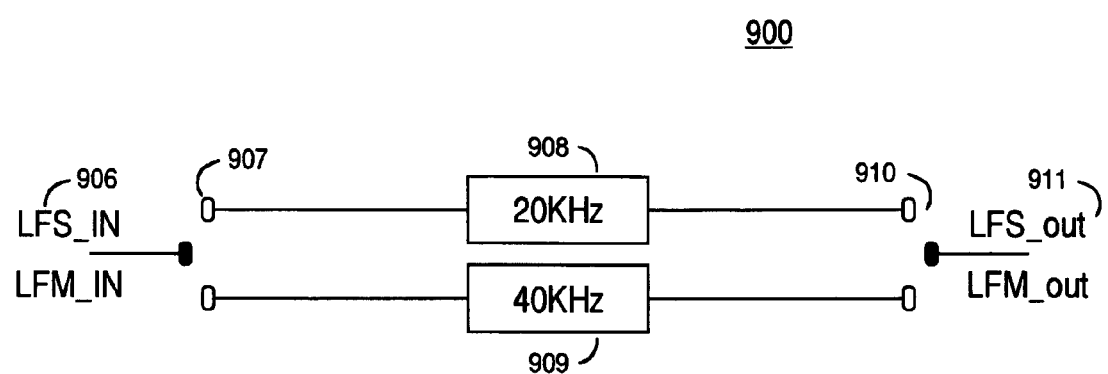
FIG. 9 shows a block diagram for the filter bank of FIG. 8A in accordance with an embodiment of the present claimed invention.

FIG. 9 shows a block diagram 900 for the filter bank of FIG. 8A in accordance with an embodiment of the present invention. The input terminal 906 accepts either a LFS_IN or LFM_IN signal as input. The input terminal 906 is selectively coupled by an input relay 907 to a first low pass filter 908 and a second low pass filter 909. Filters 908 and 909 are also selectively coupled by an output relay 910 to an output terminal 911 that provides output signals LFS_OUT and LFM_OUT. Although only two filters 908 and 909 are implemented, with passband frequencies of 20 KHz and 40 KHz respectively, more than two filters may be used in a bank with different characteristics. Generally, the passband frequencies for the low pass filters in the LF filter bank will be less than 100 KHz.

Figure 10:
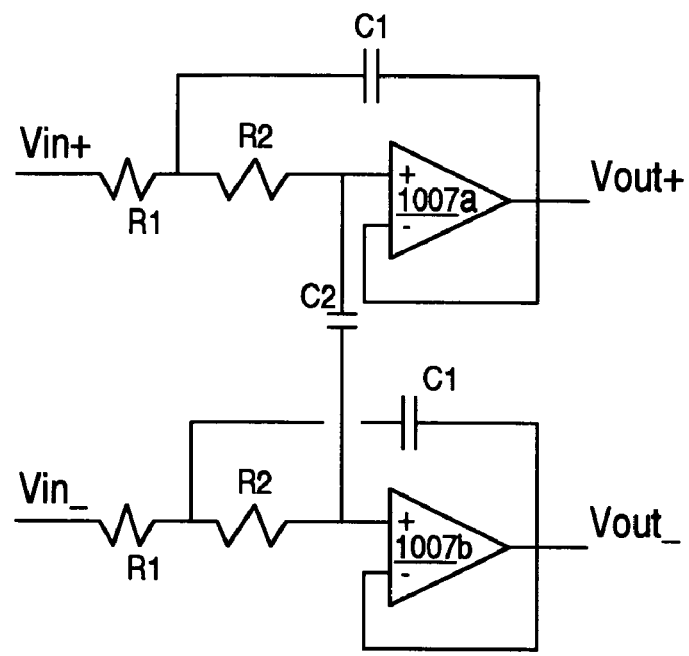
FIG. 10 shows a schematic diagram for a low pass filter for the filter bank of FIG. 9 in accordance with an embodiment of the present claimed invention.

FIG. 10 shows a schematic diagram 1000 for a low pass filter for the filter bank of FIG. 9 in accordance with a preferred embodiment of the present invention. The filter shown is an active fifth order Chebychev filter, using a second order Sallen-Key filter. Differential inputs are provided to positive inputs Vin+ and Vin− are resistively coupled to the positive input of operational amplifiers 1007*a* and 1007*b* respectively by a series combination of R1 and R2. The node between R1 and R2 is capacitively coupled to the respective negative input of each operational amplifier by a capacitor C1. The outputs of operational amplifiers 1007*a* and 1007*b* provide the differential outputs Vout+ and Vout− of the filter.

Figure 11:
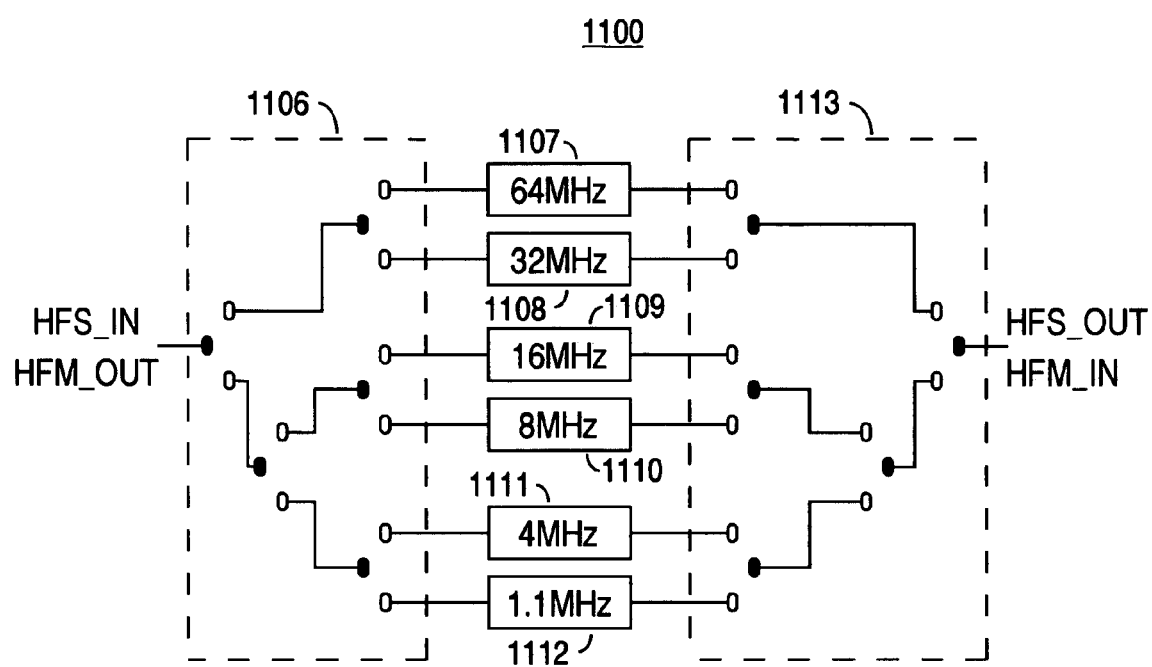
FIG. 11 shows a block diagram for the filter bank of FIG. 8B in accordance with an embodiment of the present claimed invention.

FIG. 11 shows a block diagram 1100 for the filter bank of FIG. 8B in accordance with an embodiment of the present invention. The input terminal 1105 accepts either a HFS_IN or HFM_IN signal as input. The input terminal 1105 is selectively coupled by an input relay matrix 1106 to an array of filters 1107, 1108, 1109, 1110, 1111, and 1112, having passband frequencies 64 MHz, 32 MHz, 16 MHz, 8 MHz, 4 MHz, and 1.1 MHz, respectively. Output relay matrix 1113 selectively couples the array of filters to an output terminal 1114, that provides output signals HFS_OUT and HFM_OUT. Different numbers of filters having different passband characteristics may be used. Generally, the passband frequencies for the HF filter bank will between 100 KHz and 200 MHz.

Figure 12:
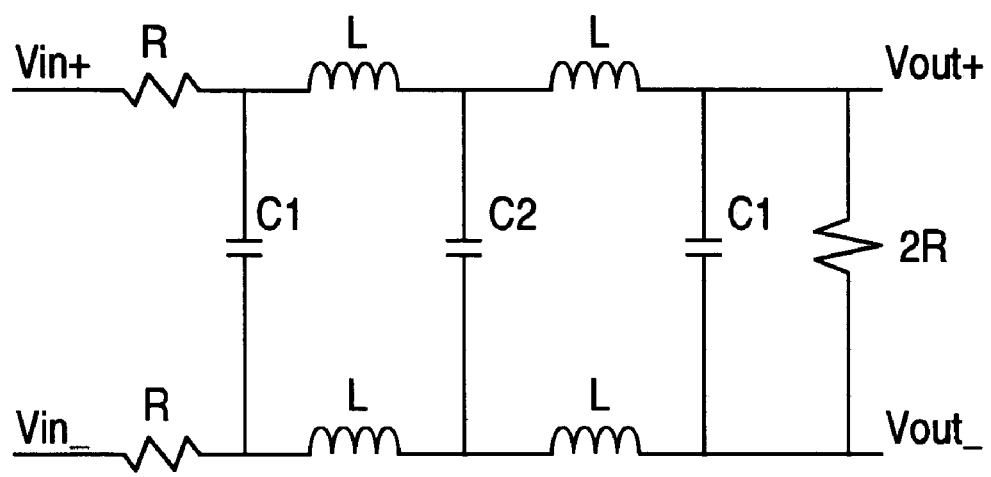
FIG. 12 shows a schematic diagram for a low pass filter for the filter bank of FIG. 11 in accordance with an embodiment of the present claimed invention.

FIG. 12 shows a schematic diagram 1200 for a low pass filter for the filter bank of FIG. 11 in accordance with an embodiment of the present invention. The passive fifth order Chebychev filter shown has differential inputs Vin+ and Vin− and differential outputs Vout+ and Vout−. The values of R, L, C1, and C2 may be adjusted to obtain different passband characteristics.

Figure 13:
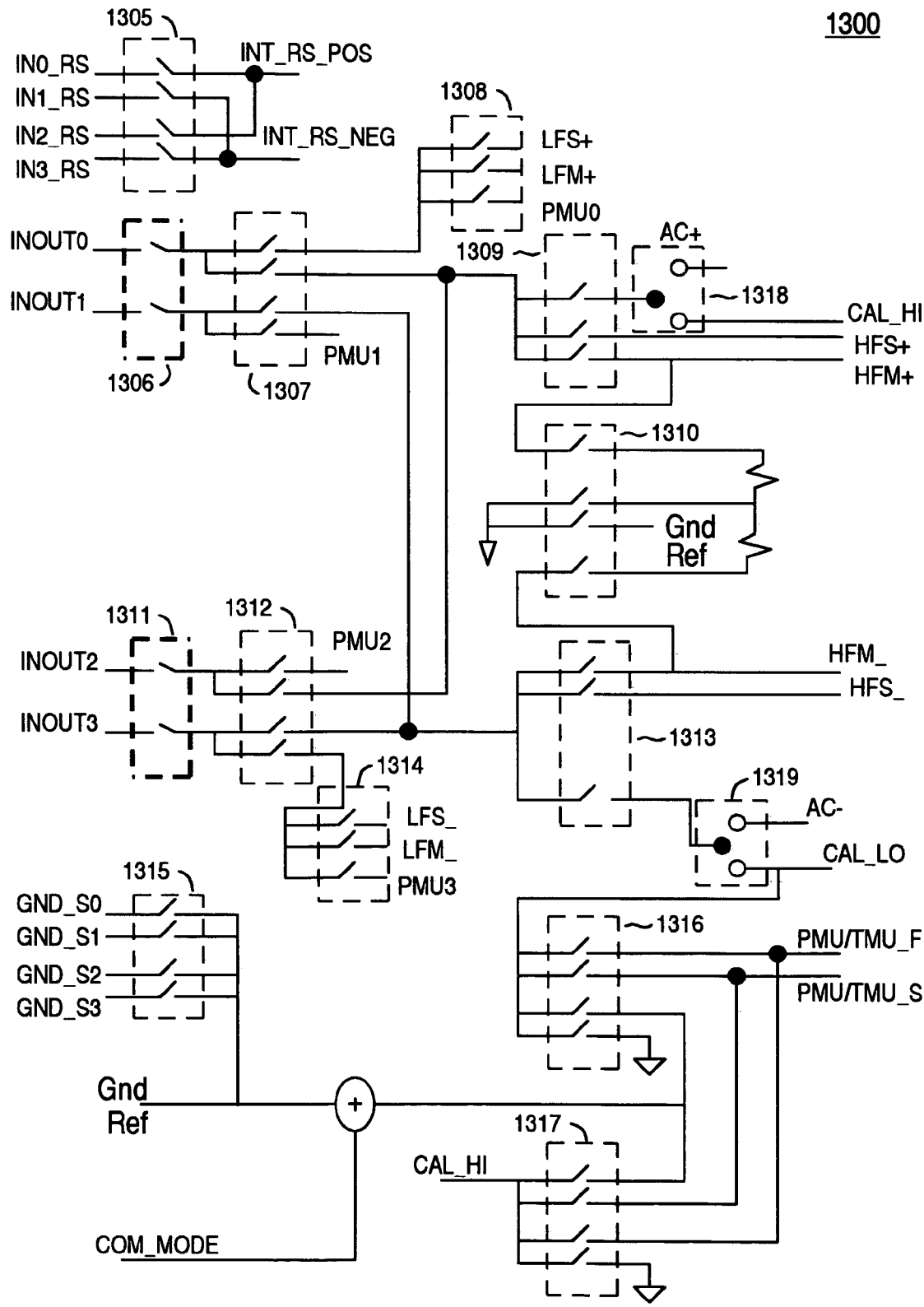
FIG. 13 shows a block diagram for the input/output switch matrix of FIG. 1 in accordance with an embodiment of the present claimed invention.

FIG. 13 shows a block diagram 1300 for the input/output switch matrix of FIG. 1 in accordance with an embodiment of the present claimed invention. The switch matrix comprises four relay blocks (1305, 1306, 1311, and 1315) that accept input from the pogo pins of the test equipment. Relay block 1305 couples four remote sense pins (IN0_RS, IN1_RS, IN2_RS, and IN3_RS) to internal remote sense inputs INT_RS_POS and INT_RS_NEG (e.g., RS+ and RS− of FIG. 3).

Relay block 1306 couples two analog source/measurement pins INOUT0 and INOUT1 to relay block 1307, which is in turn coupled to a parametric measurement unit signal input PMU1. Relay block 1307 is also coupled to relay block 1308, enabling source and measurement signals LFS+ and LFM+, and parametric measurement signal PMU0 to be coupled to INOUT0 and INOUT1.

Relay block 1309 provides for coupling of AC bypass and calibration CAL_HI (through relay 1318), HFS+, and HFM+signals to relay blocks 1307 and 1312. Relay block 1310 provides for coupling to ground reference Gnd Ref. Relay blocks 1311, 1312, 1314, and 1313, are complementary to relay blocks 1306, 1307, 1308, and 1309, respectively, and handle the other half of the differential signals. Relay block 1315 couples four ground sense pins (GND_S0, GND_S1, GND_S2, and GND_S3) ground reference Gnd Ref. Relay block 1311 couples two analog source/measurement pins INOUT2 and INOUT3 to relay block 1312, which is in turn coupled to a parametric measurement unit signal input PMU2.

Relay block 1312 is also coupled to relay block 1314, enabling source and measurement signals LFS_and LFM_, and parametric measurement signal PMU3 to be coupled to INOUT2 and INOUT3. Relay block 1313 provides for coupling of AC bypass and calibration CAL_HI (through relay 1319), HFS+, and HFM+ signals to relay blocks 1307 and 1312.

Relay block 1316 provides coupling for force and sense signals PMU/TMU_F and PMU/TMU_S from the TMU and PMU to the CAL_LO input. Relay block 1317 provides coupling for force and sense signals PMU/TMU_F and PMU/TMU_S from the TMU and PMU to the CAL_HI input.

As can be seen from FIG. 13, two differential analog or four single-ended signals may be sourced in parallel, depending upon the state of the I/O switch matrix. Also, the signals may be at high or low frequency. When measuring, only one signal may be processed at a time, but the switch matrix allows multiple pins to be addressed in turn without requiring additional relays on the external loadboard.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications are suited to the particular use contemplated. It is intended that the scope of the invention be defined by the claims appended hereto and their equivalents.

The invention claimed is:

1. A programmable module for automatic test equipment systems comprising:
 a programmable digital interface for transmitting and receiving digital data;
 a plurality of analog-to-digital converters (ADCs) coupled to said digital interface;
 a plurality of digital-to-analog converters (DACs) coupled to said digital interface;
 a first relay for selectively coupling at least one of said ADCs and at least one of said DACs to a first filter bank;
 a second relay for selectively coupling at least one of said ADCs and at least one of said DACs to a second filter bank;
 a first source block and a first measure block coupled to said first filter bank and also coupled to an input/output switch matrix, and wherein said first filter bank is shared by said first source block and said first measure block; and
 a second source block and a second measure block coupled to said second filter bank and also coupled to said input/output switch matrix, and wherein said second filter bank is shared by said second source block and said second measure block.

2. The module of claim 1, wherein said first filter bank comprises a filter with a passband frequency less than 100 KHz and said second filter bank comprises a filter with a passband frequency greater than 100 KHz and less than 200 KHz.

3. The module of claim 1, wherein said first filter bank comprises active filters and said second filter bank comprises passive filters.

4. The module of claim 1 wherein said module comprises at least three ADCs.

5. The module of claim 1, wherein one of said DACs has a resolution of at least 14 bits and one of said ADCs has a resolution of at least 14 bits.

6. The module of claim 1, wherein at lease one of said DACs has a resolution of at least 24 bits and one of said ADCs has a resolution of at least 24 bits.

7. The module of claim 1, further comprising a first AC coupling between one of said DACs and said input/output switch matrix, and a second AC coupling between one of said ADCs and said input/output switch matrix.

8. A programmable module for automatic test equipment systems comprising:
 a programmable digital interface for transmitting and receiving digital data;
 a plurality of analog-to-digital converters (ADCs) coupled to said digital interface;
 a plurality of digital-to-analog converters (DACs) coupled to said digital interface;
 a plurality of filters selectively coupled to said ADCs and selectively coupled to said DACs;
 at least one source block and at least one measure block coupled to said plurality of filters, said source block and said measure block comprising:
  a plurality of amplifiers selectively coupled to said filters; and
  a plurality of attenuators coupled to said amplifiers;
  wherein at least one of said plurality of filters is shared by said source block and said measure block; and
 an input/output switch matrix coupled to said attenuators.

9. The module of claim 8, wherein said plurality of filters comprises a filter with a passband frequency of less than 100 KHz and a filter with a passband frequency greater than 100 KHz.

10. The module of claim 9, wherein said plurality of filters comprises both active filters and passive filters.

11. The module of claim 9, wherein said plurality of filters comprises fifth order filters.

12. The module of claim 9, wherein said plurality of DACs comprises a first DAC and a second DAC, wherein said first DAC has a different resolution than said second DAC.

13. The module of claim 9, wherein said plurality of DACs comprises a first ADC and a second ADC, wherein said first ADC has a different resolution than said second ADC.

14. The module of claim 9, wherein said input/output switch matrix is coupled to an array of pogo pins.

15. The module of claim 14, wherein said array of pogo pins comprises pins for ground sense.

16. The module of claim 15, wherein said array of pogo pins comprises pins for remote sense.

17. A programmable module for automatic test equipment systems comprising:
 a programmable digital interface for transmitting and receiving digital data;
 a plurality of analog-to-digital converters (ADCs) coupled to said digital interface;
 a plurality of digital-to-analog converters (DACs) coupled to said digital interface;
 an array of pogo pins, said array comprising a plurality of analog input/output pins; and
 a differential filter bank selectively coupled to the DACs, selectively coupled to the ADCs, and also selectively coupled to said analog input/output pins;
 wherein said programmable module is operable to provide a selectable resolution.

18. The module of claim 17, wherein said array of pogo pins is coupled to said differential filter bank by an input/output switch matrix.

19. The module of claim 18, wherein said array of pogo pins comprises ground sense pins.

20. The module of claim 18, wherein said array of pogo pins comprises remote sense pins.

* * * * *